US006743992B1

(12) United States Patent
Hsu et al.

(10) Patent No.: US 6,743,992 B1
(45) Date of Patent: Jun. 1, 2004

(54) RETAINING DEVICE FOR SENSOR

(75) Inventors: Yun-Lin Hsu, Tu-Chen (TW); Li Ping Chen, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/325,187

(22) Filed: Dec. 19, 2002

(30) Foreign Application Priority Data

Nov. 29, 2002 (TW) ..................................... 91219305 U

(51) Int. Cl.[7] .................................................. H10H 1/26
(52) U.S. Cl. ....................................... 200/293; 200/303
(58) Field of Search ................................ 200/293, 295, 200/296, 303, 307, 573, 50.1, 61.41, 61.42, 61.62, 61.67, 61.78, 61.81, 61.82

(56) References Cited

U.S. PATENT DOCUMENTS 6,356,450 B1 * 3/2002 Andreasen et al. ......... 361/759
6,404,624 B1 * 6/2002 Jeong ......................... 361/683
6,538,879 B2 * 3/2003 Jiang .......................... 361/683

* cited by examiner

*Primary Examiner*—Michael Friedhofer
*Assistant Examiner*—Lisa Klaus
(74) *Attorney, Agent, or Firm*—Wei Te Chung

(57) ABSTRACT

A retaining device (30) for a sensor (10) includes a front wall (34), a rear wall (32), and a sidewall (36) connecting between the front wall and the rear wall. a pair of poles (361) extends perpendicularly from the sidewall. A pair of L-shaped hooks (38, 321) is arranged at the front and rear walls respectively. The sensor defines a pair of through holes (16). In assembly, the sensor is received in the retaining device, with the poles of the retaining device being received in the through holes of the sensor. The combined retaining device and sensor is then attached to an internal side panel (54) of a computer enclosure (50). The hooks resiliently engage with the internal side panel at aperture (541) thereof.

15 Claims, 5 Drawing Sheets

RETAINING DEVICE FOR SENSOR

BACKGROUND OF THE INVENTION

1. Field of the Invention

The present invention relates to a retaining device for electronic components, and more particularly to a retaining device for a sensor.

2. Descriptionn of the Related Art

When using a computer, a user may need to know the state of an enclosure of the computer for safety and maintenance reasons. A sensor installed in the enclosure can detect whether a cover of the enclosure is in a closed position. Taiwan Patent No. 215298 discloses a retaining device for a sensor switch. The retaining device comprises a rectangular bottom wall, and a plurality of holes is defined in the bottom wall. An elastic obtuse sidewall extends upwardly from one end of the bottom wall, and an L-shaped sidewall extends from an opposite end of the bottom wall. In assembly, the obtuse sidewall is pushed outwardly, and a switch is received between the obtuse and L-shaped sidewalls. The obtuse sidewall is then released, whereupon it rebounds and clamp the switch between the obtuse and L-shaped sidewalls. A plurality of screws is extended into the holes of the bottom wall for fastening the combined switch and retaining device to another device. However, the retaining device only restricts movement of the switch along a first axis that is perpendicular to the obtuse and L-shaped sidewalls. The retaining device does not restrict movement of the switch along a second axis that is parallel to the obtuse and L-shaped sidewalls. In addition, attachment of the retaining device using screws is unduly laborious and time consuming. Furthermore, a tool is usually required for installation and removal of the screws.

SUMMARY OF THE INVENTION

Accordingly, an object of the present invention is to provide a retaining device which enables a sensor to be easily and securely attached to a computer enclosure.

To achieve the above object, a retaining device for a sensor in accordance with the present invention comprises a front wall, a rear wall and a sidewall connecting between the front wall and the rear wall. A pair of poles extends perpendicularly inwardly from the sidewall. A pair of L-shaped hooks is arranged at the front and rear walls respectively. The sensor defines a pair of through holes. In assembly, the sensor is received in the retaining device, with the poles of the retaining device being received in the through holes of the sensor. The combined retaining device and sensor is then attached to an internal side panel of a computer enclosure. The hooks resiliently engage with the internal side panel at apertures thereof.

Other objects, advantages and novel features of the present invention will be drawn from the following detailed description of a preferred embodiment of the present invention with the attached drawings, in which:

DESCRIPTION OF THE PREFERRED EMBODIMENT

Figure 1:
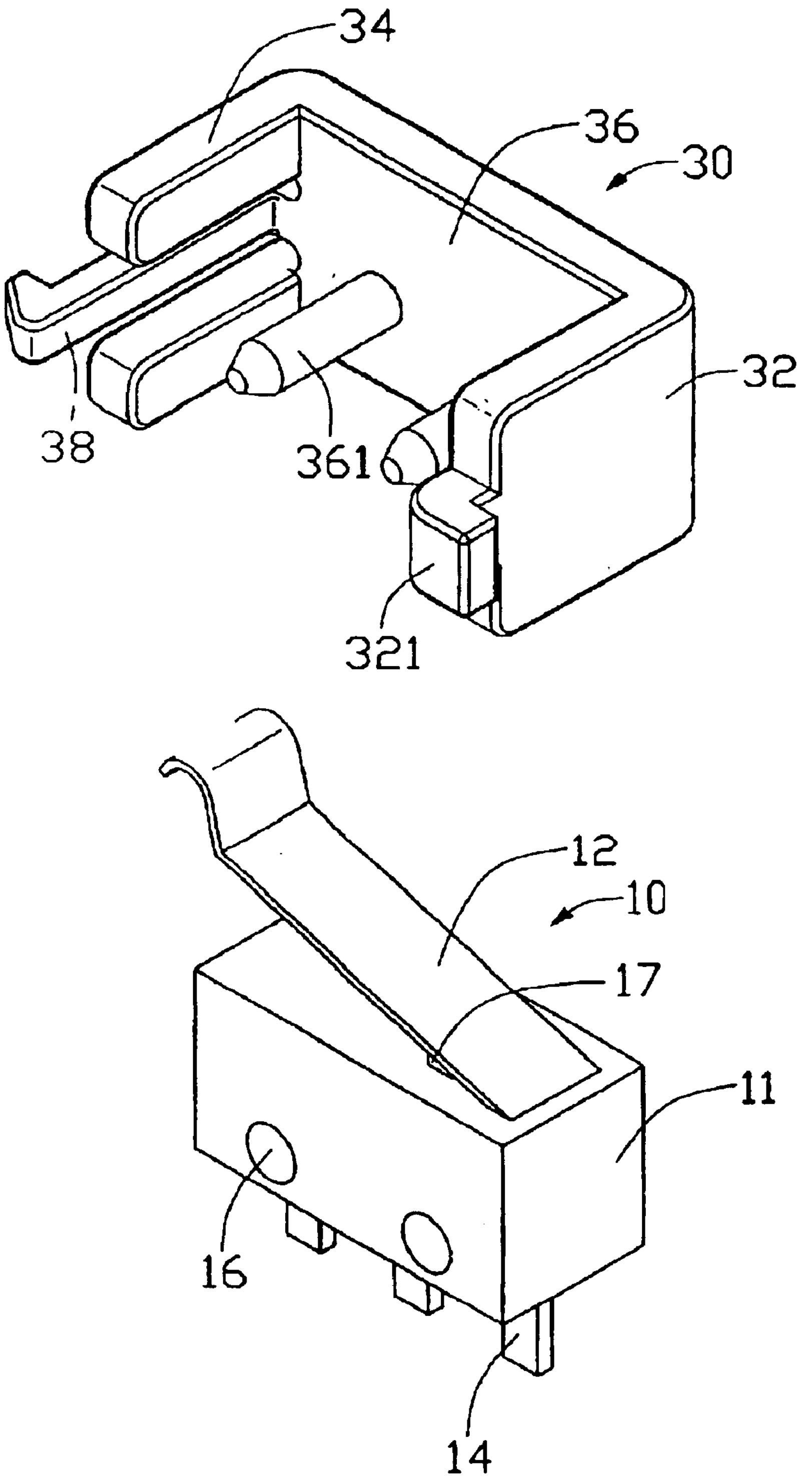
FIG. 1 is an isometric view of a retaining device in accordance preferred embodiment of the present invention, together with a sensor.
Figure 2:
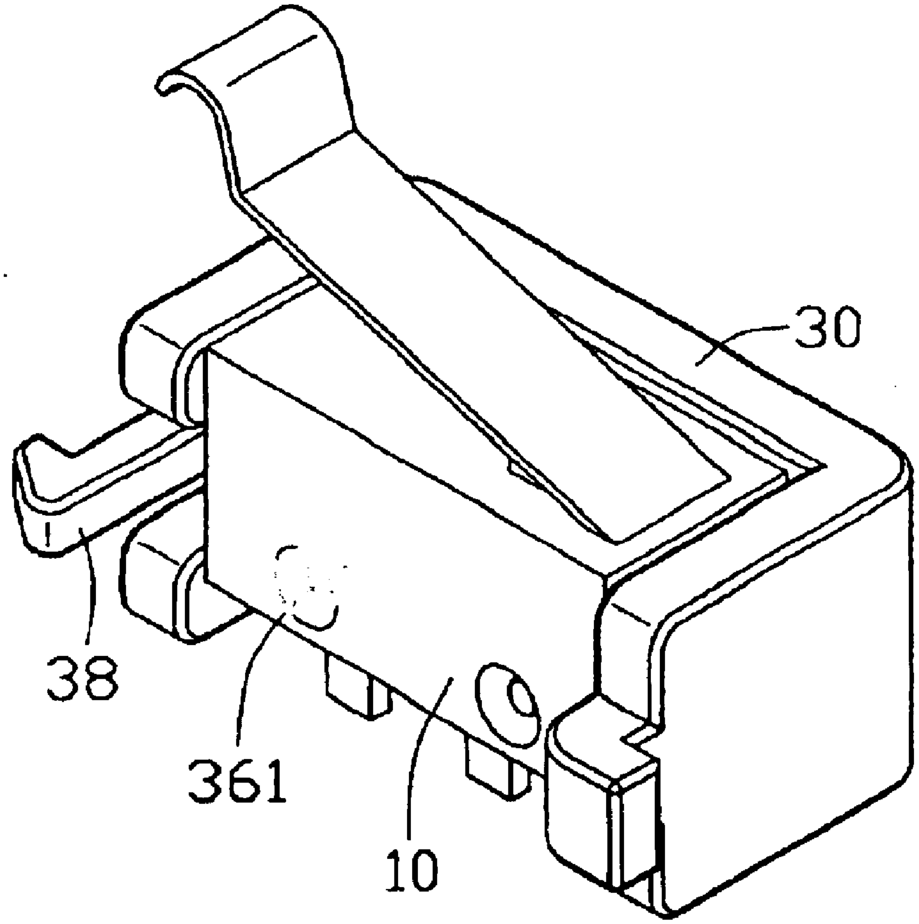
FIG. 2 is an assembled view of FIG. 1.
Figure 3:
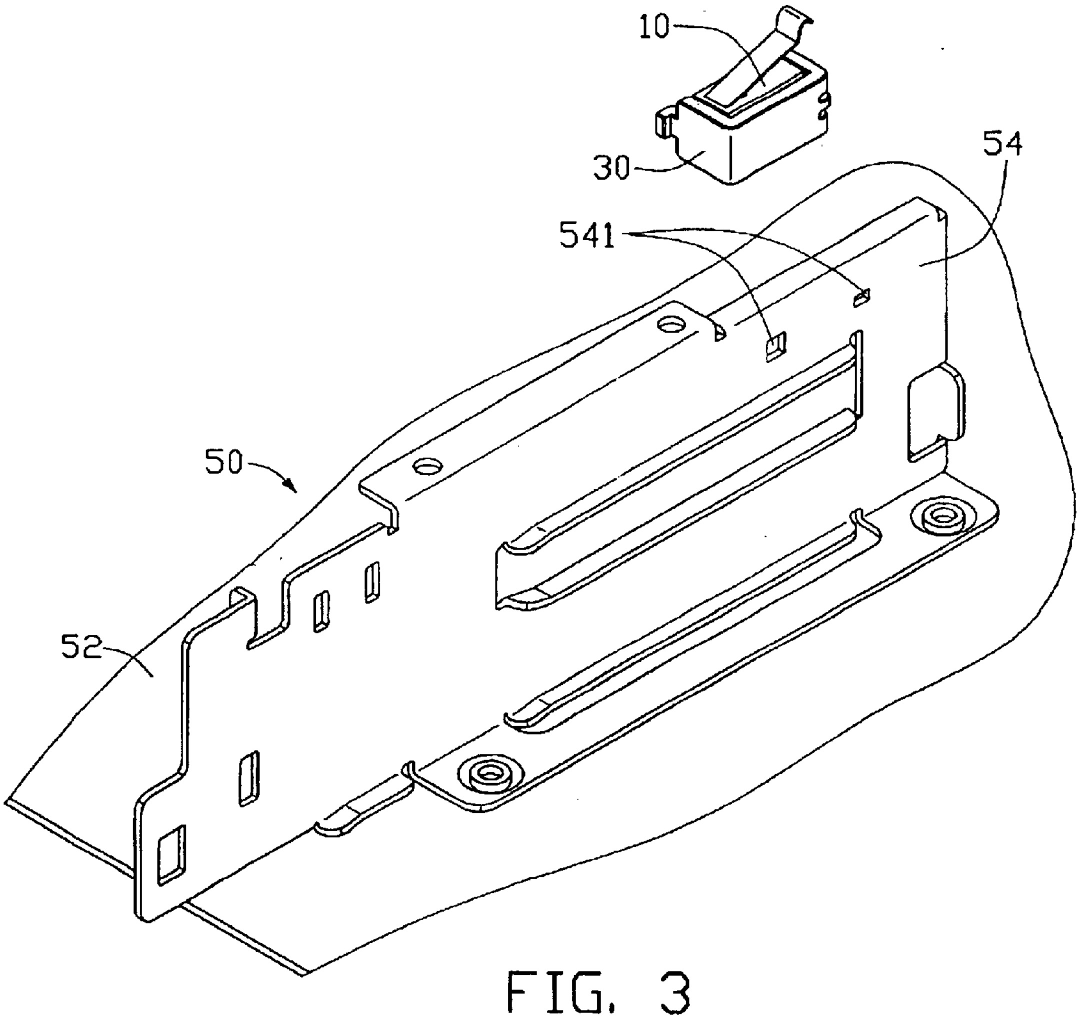
FIG. 3 is an isometric view of the combined retaining device and sensor of FIG. 2 viewed from another aspect, together with an internal side panel of a computer enclosure.
Figure 4:
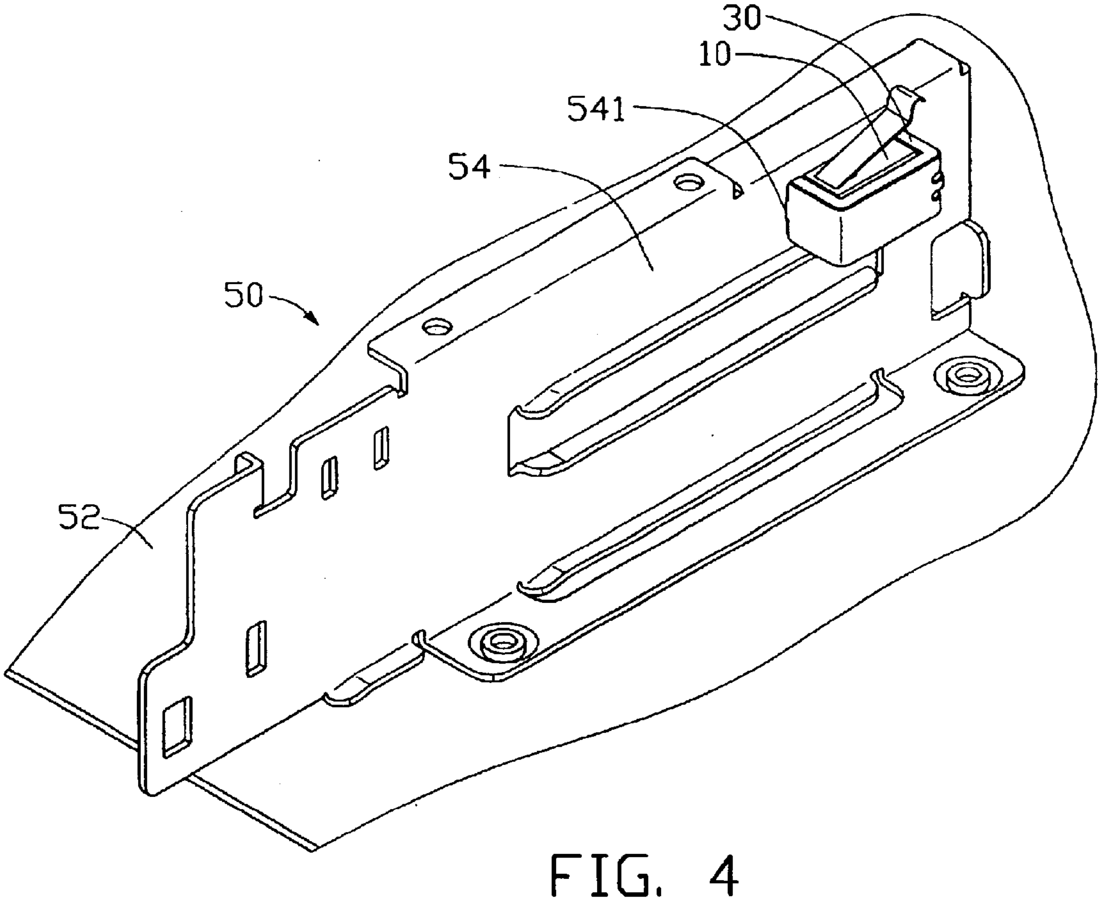
FIG. 4 is an assembled view of FIG. 3.
Figure 5:
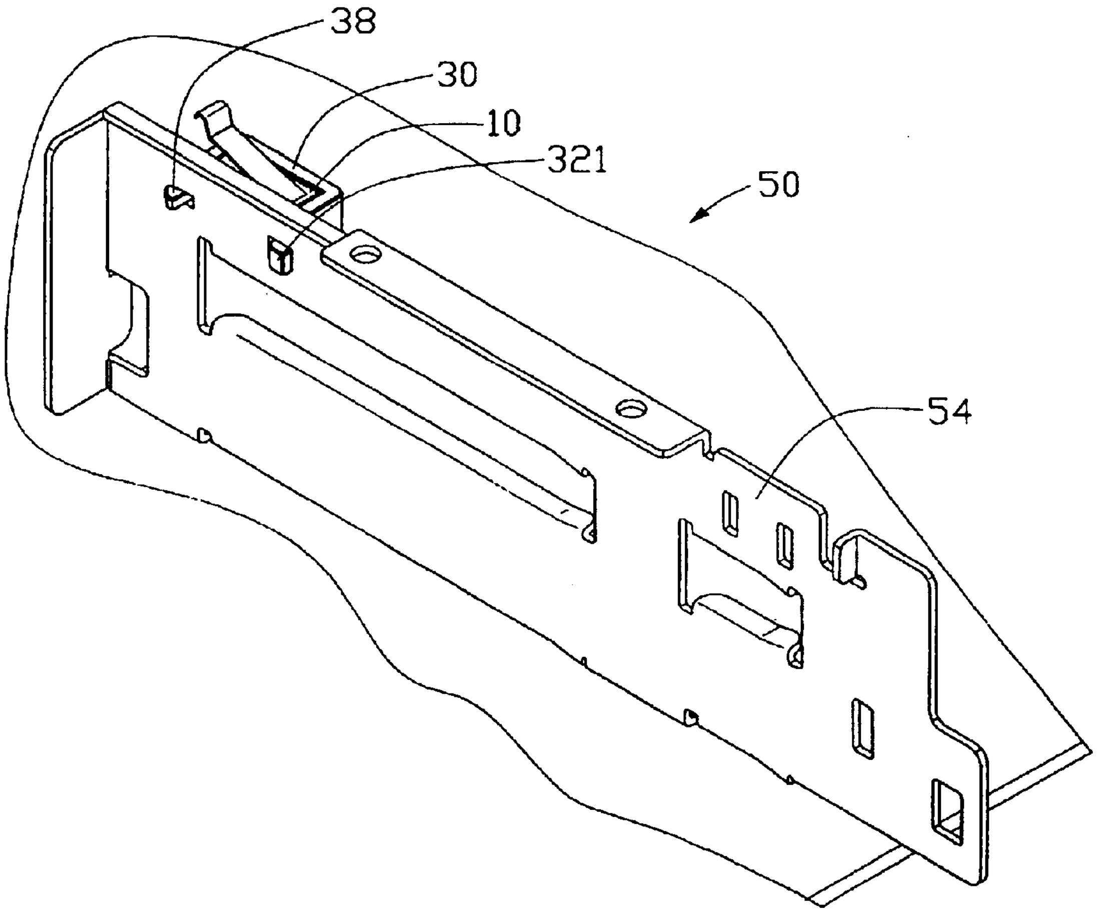
FIG. 5 is similar to FIG. 4, but viewed from another aspect.

Referring to FIGS. 1 to 3, a retaining device 30 in accordance with a preferred embodiment of the present invention is provided for attaching a sensor 10 to a computer enclosure 50.

The sensor 10 comprises a parallelepiped body 11. An elastic plate 12 extends obliquely upwardly from near an end of a top surface of the body 11. Three aligned terminals 14 depend from a bottom surface of the body 11. A pair of spaced, parallel through holes 16 is defined through the body 11 between opposite side surfaces thereof, near the bottom surface thereof. A contact 17 is disposed on the top surface of the body 11 under the elastic plate 12. When the elastic plate 12 touches the contact 17, the contact 17 can produce a signal that is output from the terminals 14.

The retaining device 30 comprises a front wall 34, a rear wall 32, and a sidewall 36 connecting between the front wall 34 and the rear wall 32. A through opening (not labeled) is defined in the front wall 34. An L-shaped first hook 38 perpendicularly extends from an end of the sidewalll 36 into the through opening, such that a free end of the first hook 38 protrudes forwardly of a front face of the front wall 34. The free end of the first hook 38 can resiliently retract to a position corresponding to the opening when external force is applied thereto. A pair of spaced, parallel poles 361 extends perpendicularly inwardly from the sidewall 36, corresponding to the.through holes 16 of the sensor 10. An L-shaped second hook 321 integrally extends from a free end of the rear wall 32.

The computer enclosure 50 comprises a top panel (not shown), a bottom panel 52, and an internal side panel 54. A pair of spaced apertures 541 is defined in an upper portion of the internal side panel 54, corresponding to the first and second hooks 38, 321 of the retaining device 30.

Referring to FIGS. 2 to 5, in assembly and use, the sensor 10 is first received in the retaining device 30. The poles 361 of the retaining device 30 are received in the through holes 16 of the sensor 10. The combined retaining device 30 and sensor 10 is then attached to the internal side panel 54 of the computer enclosure 50. The first and second hooks 38, 321 of the retaining device 30 are engagingly received in the corresponding apertures 541 respectively. The second hook 321 engages with a rear surface of the internal side panel 54. During insertion of the first hook 38 into the corresponding aperture 541, the free end of the first hook 38 rides over an edge of the internal side panel 54 and resiliently retracts. When said free end of the first hook 38 has completely passed over said edge of the internal side panel 54, it rebounds and snappingly engages with the rear surface of the internal side panel 54. The sensor 10 is thus securely attached to the computer enclosure 50 by the first and second hooks 38, 321.

In this position, movement of the sensor 10 in any, direction parallel to the internal side panel 54 is restricted by the front wall 34, the rear wall 32 and the poles 361 of the retaining device 30. Movement of the sensor 10 in directions perpendicular to the internal side panel 54 is restrained by the sidewall 36 of the retaining device 30 and the internal side panel 54. The elastic plate 12 protrudes upwardly beyond a top extremity of the internal side panel 54. Thus when the top panel of the computer enclosure 50 is closed, the top panel pushes the elastic plate 12 downwardly to touch the contact 17 of the sensor 10, and a "closed" signal is output through the terminals 14 of the sensor 10.

In disassembly, said free end of the first hook 38 is pressed resiliently inwardly, and the first and second hooks 38, 321 are then pushed out from the apertures 541 of the internal side panel 54. The retaining device 30 is thus detached from the computer enclosure 50.

While the present invention has been illustrated by the description of the preferred embodiment thereof, and while the preferred embodiment has been described in considerable detail, it is not intended to restrict or in any way limit the scope of the appended claims to such detail. Additional advantages and modifications within the spirit and scope of the present invention will readily appear to those skilled in the art. Therefore, the present invention is not limited to the specific details and illustrative examples shown and described.

What is claimed is:

1. A retaining device for attaching a sensor to a computer enclosure, the sensor defining a pair of holes, the retaining device comprising:

a first wall, a first hook being arranged at the first wall;

a second wall, a second hook being arranged at a free end of the second wall, wherein the first and second hooks are for resiliently engaging with the computer enclosure; and a third wall connecting between the fist wall and the second wall to define a space therebetween for accommodating the sensor therein, a pair of protrusions being arranged at the third wall for engaging in the holes of the sensor respectely.

2. The retaining device as claimed in claim 1, wherein an opening is defined in the first wall, and the first hook extends from an end of the third wall into the opening.

3. The retaining device as claimed in claim 2, wherein a free end of the first hook protrudes outwardly beyond an outer face of the first wall.

4. The retaining device as claimed in claim 1, wherein the second hook integrally extends from the free end of the second wall.

5. The retaining device as claimed in claim 1, wherein each of the first and second hooks has an L-shaped profile.

6. A retaining device assembly comprising:

a computer enclosure comprising a panel defining a pair of apertures therein;

a sensor defining a pair of holes; and a retaining device comprising a space accommodating the sensor therein, a pair of protrusions disposed in the space and received in the holes of the sensor respectively, and first and second hooks resiliently engaging in the apertures of the panel of the computer enclosure respectively thereby securing the retaining device to the computer enclosure.

7. The retaining device assembly as claimed in the claim 6, wherein the sensor comprises a parallelepiped body, an elastic plate obliquely extends from a main face of the parallelepiped body, and a plurality of terminals extends from an opposite main face of the parallelepiped body.

8. The retaining device assembly as claimed in the claim 6, wherein each of the protrusions is a pole.

9. The retaining device assembly as claimed in the claim 6, wherein the retaining device comprises a first wall, a second wall and a third wall connecting between the first and second walls, and the space is defined by the first, second and third walls.

10. The retaining device assembly as claimed in the claim 9, wherein an opening is defined in the first wall, and the first hook of the hooks extends from an end of the third wall into the opening.

11. The retaining device assembly as claimed in the claim 9, wherein the second hook of the hooks integrally extends from the second wall.

12. A retainer device assembly comprising:

a panel defining opposite first and second holes;

a sensor defining a rectangular parallelepiped configuration;

a retaining device defining a generally U-like frame with therein a space snugly receiving said sensor, said U-like frame including opposite first and second walls connected by third wall, said first and second walls having a relatively rigid hook and a relative resilient hook, respectively latched to the corresponding first and second holes; wherein said first and second walls are perpendicular to said panel while said third wall is parallel to said panel, and interengaging mechanism is formed between the sensor and the retaining device to allow said sensor to be assembled to the retaining device in a direction perpendicular to said third wall while preventing relative movement, after assembled, between the sensor and the retaining device in other directions perpendicular to said direction.

13. The assembly as claimed in claim 12, wherein said sensor is sandwiched between the panel and the third wall.

14. The assembly as claimed in claim 12, wherein said sensor includes a resilient plate deflectably open to an exterior in a direction perpendicular to said direction.

15. The assembly as claimed in claim 12, wherein said interengaging mechanism includes a post extending from the third wall toward the panel, and a hole defined in the sensor.

* * * * *